United States Patent [19]

Izawa et al.

[11] Patent Number: 5,444,785
[45] Date of Patent: Aug. 22, 1995

[54] ECHO ATTACHING CIRCUIT AND AUDIO DEVICE USING THE SAME

[75] Inventors: Kaoru Izawa; Shigeyoshi Hayashi; Jun Hirai, all of Kyoto, Japan

[73] Assignee: Rohm Co., Ltd., Kyoto, Japan

[21] Appl. No.: 347,197

[22] Filed: Nov. 21, 1994

Related U.S. Application Data

[63] Continuation of Ser. No. 8,712, Jan. 25, 1993, abandoned.

[30] Foreign Application Priority Data

Jan. 24, 1992 [JP] Japan .................. 4-034125
Sep. 3, 1992 [JP] Japan .................. 4-260666

[51] Int. Cl.⁶ ............................. H03G 3/00
[52] U.S. Cl. ........................ 381/63; 381/106
[58] Field of Search ............ 381/63, 64, 106; 333/14

[56] References Cited

U.S. PATENT DOCUMENTS

| | | | |
|---|---|---|---|
| 4,438,525 | 3/1984 | Shibata et al. | 381/63 |
| 4,550,426 | 10/1985 | Gillig et al. | 381/106 |
| 4,611,300 | 9/1986 | Taylor, Jr. et al. | 381/63 |
| 5,131,051 | 7/1992 | Kishinaga et al. | 381/63 |
| 5,146,507 | 9/1992 | Satoh et al. | 381/63 |

OTHER PUBLICATIONS

Chamberlin, Musical Applications of Microprocessors, 1980, pp. 344, 345, 353, 379–381.

*Primary Examiner*—Forester W. Isen
*Attorney, Agent, or Firm*—Fay, Sharpe, Beall, Fagan, Minnich & McKee

[57] ABSTRACT

An analog signal to be delayed thereby is compressed according to a monotonously increasing, convex compression function and sent to a delay circuit constituted digitally. Data of a digital value stored in a memory is read out after a constant delay time and converted into an analog signal by a D/A converter. The analog signal is expanded according to a reverse function of the compression function to restore it as an echo signal.

8 Claims, 4 Drawing Sheets

ECHO ATTACHING CIRCUIT AND AUDIO DEVICE USING THE SAME

This is a continuation application of Ser. No. 08/008,712, filed Jan. 25, 1993, now abandoned.

BACKGROUND OF THE INVENTION

1. Technical Field

The present invention relates to an echo attaching circuit and an audio device using the same and, particularly, to an improvement of a circuit for producing an echo signal from an audio signal and attaching the echo signal to the audio signal, that is, an echo attaching circuit to be used in an audio device such as Karaoke device, component stereo device, radio cassette device or VTR, etc.

2. Background Art

Almost all of the recent audio devices are equipped with the so-called Karaoke function with which an audio input from a microphone can be mixed or synthesized with another reproduced signal, etc., and output externally. For such function, an echo attaching function for attaching an echo effect is indispensable for which the echo signal must be internally produced. Echo signal is usually produced by delaying an audio signal, which is obtained by converting an audio information such as voice and/or music into an electric signal, by a certain constant time. In order to enhance the echo effect, the echo attaching circuit operates to attenuate the audio signal and the echo signal and feeds back them to the side of the audio signal to produce a signal which is a mixture of the audio signal and the fed back signal, and the delaying and mixing operations are repeated for thus the produced signal.

FIG. 5 shows an example of a construction of a conventional echo attaching circuit. In FIG. 5, an echo attaching circuit 8 includes a waveform synthesizing circuit 1, a low-pass filter (LPF) 2, a delay circuit 3 using a BBD (Bucket Brigade Device), a low-pass filter 4, attenuators (ATTs) 5 and 6 and a waveform synthesizer 7.

An audio signal A input to the echo attaching circuit 8 is synthesized or combined in the waveform synthesizer 7 with a signal which is obtained by attenuating an echo signal B down to a suitable level by the attenuator 6, resulting in an audio signal C to which the echo is attached. The audio signal C is amplified and output from a loudspeaker as sound or recorded on such as tape by means of a recording circuit.

The echo signal B is produced by a feedback loop including the attenuator. That is, the echo signal B output is attenuated by the attenuator 5 down to a suitable level and fed back to an input side in which it is mixed with the audio signal A by the waveform synthesizer 1. Then, the synthesized signal is passed through the low-pass filter 2, resulting in a signal D. A delay signal E is produced by delaying the signal D by a constant time by the delay circuit (BBD) 3 and the echo signal B is produced by passing the signal E through the low-pass filter 4. The low-pass filters 2 and 4 are provided in an upstream and a down stream of the BBD 3 to prevent an aliasing distortion by allowing components whose frequencies are lower than a half of a sampling frequency of the BBD 3 to pass through. By removing a noise component of the delay signal E by means of the low-pass filter 4, the delay signal E becomes the echo signal B. The audio signal becomes the echo signal by further attenuating the echo signal E thus produced by delay and this is circulated while being attenuated and the echo effect is obtained by repeating this procedure.

The BBD 3 having construction for delaying an analog signal itself is noise-sensitive and easily degraded with time. Therefore, its accuracy and reliability are insufficient. On the other hand, demand of improvement of function of the audio device by users or customers is becoming severe more and more, and, for example, a dynamic range of about 90 dB is required for an audio signal with echo signal in Karaoke function.

In order to satisfy such demand, it is a recent tendency that the portion of the delay circuit 3 is constituted with, instead of BBD, a digital circuit capable of improving the function.

FIG. 6 shows a block circuit of a delay portion of the delay circuit 3 when it is replaced by a digital circuit. The delay portion includes an A/D converter 31, a memory control circuit (CTRL) 32, a memory 33 and a D/A converter 34. In this delay circuit, a signal D from the low-pass filter 2 is converted by the A/D converter 31 into a digital value. The memory control circuit 32 stores the digital value in the memory 33 in sequence. The memory control circuit 32 reads out from the memory 33 sequentially digital values stored at a time prior to a current time by a constant time and sends them to the D/A converter 34. The D/A converter 34 converts them into analog values and outputs them to the low-pass filter 4 as the delay signal E.

By employing such digital circuit, influence of the sensitivity to noise and the degradation with time can be prevented.

SUMMARY OF THE INVENTION

In the delay circuit constituted with a digital circuit, the accuracy depends basically on the number of bits of a digital data, the higher the accuracy being the larger the number. For example, in order to obtain a dynamic range of 90 dB, the number of bits of a digital value to be handled by the circuits 31, 32, 33 and 34 must be 15 or more since accuracy of 1 bit corresponds to about 6 dB.

When a delay is processed digitally, the number of bits to be processed is large and a memory of large capacity and highly accurate A/D and D/A converters are required practically. For this reason, its cost is high and it is impossible to easily use such digital delay circuit in an audio device whose cost restriction is very severe, regardless of its high accuracy.

An object of the present invention is, therefore, to provide an echo attaching circuit capable of obtaining a dynamic range corresponding to a large number of bits equivalently while using a delay circuit which is constructed to process a smaller number of bits.

Another object of the present invention is to provide an audio device having an echo attaching circuit which is inexpensive and capable of obtaining a large dynamic range.

In order to achieve these objects, an echo attaching circuit according to the present invention comprises an analog signal compression circuit responsive to an audio signal or a signal including an audio signal and an echo signal for compressing the audio signal or the signal according to a compression function exhibiting compression rate for a large amplitude range larger than that for smaller amplitude, an A/D converter for converting an output of the analog signal conversion circuit into a digital signal, a memory for storing the digital signal, a D/A converter for converting the digital signal stored in the memory for a predetermined delay time into an analog signal and for supplying the analog signal as a delay signal, and an analog expansion conversion circuit for expanding the delay signal according to a reverse function to the compression function and outputting it as an echo signal.

In the present invention, the digital delay circuit is used to which an analog signal compressed according to a compression function expressing a slightly convexed monotonously increasing curve is sent. After a constant delay time, data of a digital data stored in a memory is read out and converted to recover the analog signal by a D/A converter. The recovered analog signal is expanded according to a reverse compression function to obtain an echo signal.

Due to the non-linearity of the compression function, that is, the existence of the convexed portion, tone of a signal having large amplitude, that is, tone of large sound may be degraded. However, it is possible to reproduce small sound without considerable degradation of tone even if the digital conversion is made by using a minimum number of bits.

In other words, compared with a case where, in digitizing the same number of bits, the compression is not performed, it is possible to improve the dynamic range by a corresponding amount to the sacrifice of tone of large sound. Further, by the digital conversion and the subsequent storage thereof in the memory, the delaying can be performed stably. Further, since the compression function is of the monotonous increase, the reverse function thereof can be obtained easily. Therefore, although tone of the echo signal may be degraded compared with the original signal regardless of the sacrifice of the large sound, it is possible to maintaining the improved dynamic range. Since tone of small sound is not sacrificed, the echo effect becomes remarkable. This is because, when a person or persons sing a song, its sound volume is within a certain level range and hardly becomes very large volume.

Echo signal in an echo attaching circuit is not a final output signal but output together with an original signal. Therefore, the accuracy of the original signal is maintained. When the original signal is a large amplitude, considerable degradation of tone quality of echo signal which is an attached signal is hardly noticed by listeners, since their attention may be directed to the original signal. Tone quality of a large sound signal with echo is aware less by listener's ears than that of a small or minute sound signal when a sound signal with echo is output as a sound.

Therefore, in the echo attaching circuit according to the present invention, tone quality of a finally output signal necessary for Karaoke function is maintained as a whole even if it is compressed/expanded to reduce the number of bits in the digital circuit while maintaining dynamic range. Thus, it is possible to maintain dynamic range corresponding to a larger number of bits by using a delay circuit of a smaller number of bits and to simplify the A/D converter circuit and the D/A converter circuit. Further, it is possible to reduce the memory capacity, resulting in a circuit suitable as an echo attaching circuit of an audio device having Karaoke function.

DESCRIPTION OF THE PREFERRED EMBODIMENTS

Figure 1:
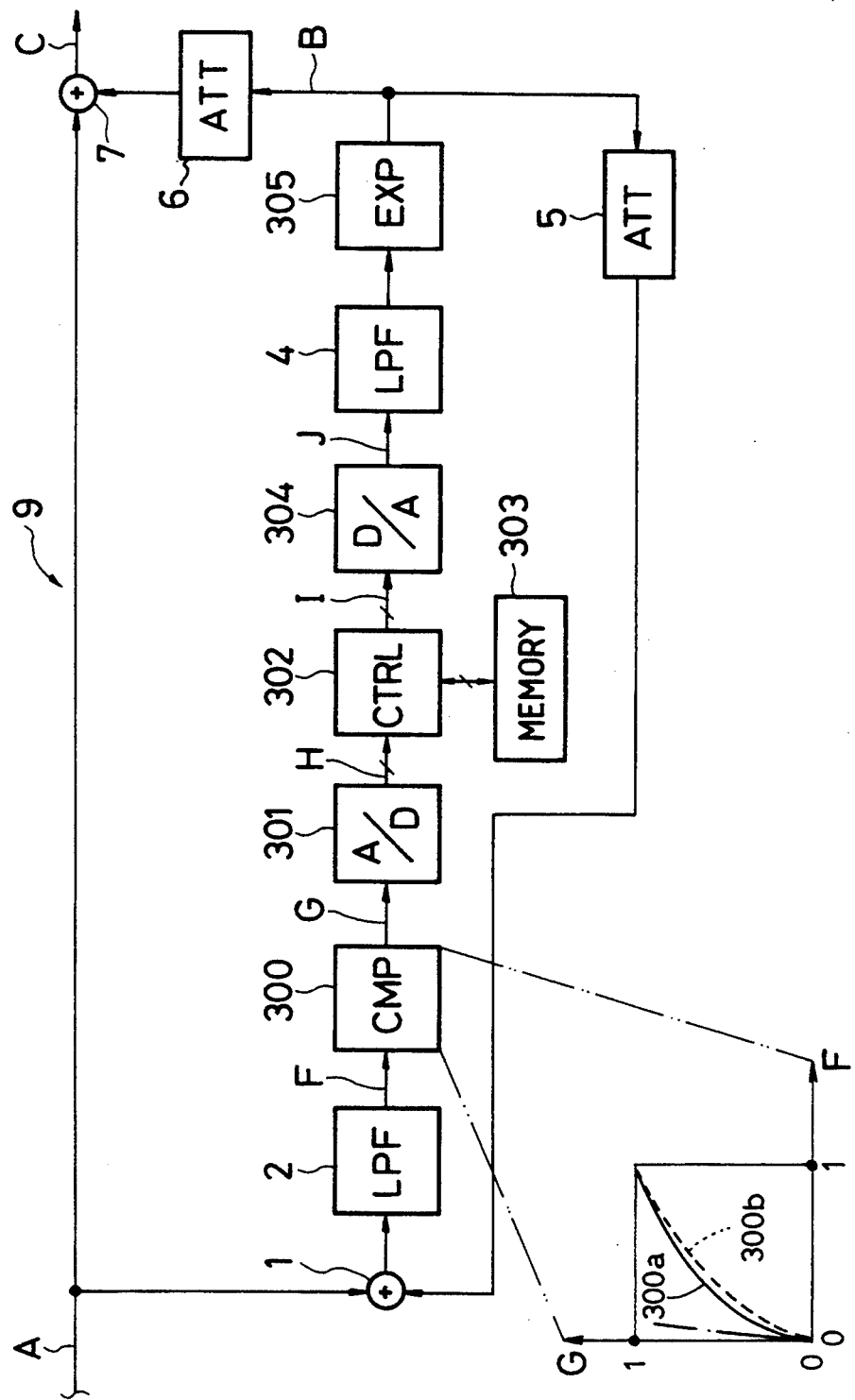
FIG. 1 is a block circuit diagram of an embodiment of an echo attaching circuit according to the present invention.

FIG. 1 shows an embodiment of an echo attaching circuit 9 according to the present invention, which comprises a waveform synthesizer 1, low-pass filters (LPFs) 2 and 4, attenuators (ATTs) 5 and 6 and a waveform synthesizer 7. Since these components are identical to those of the conventional echo attaching circuit, details of them are omitted here.

The echo attaching circuit 9 further comprises a digital delay circuit constituted with an analog compression circuit (CMP) 300, an A/D converter circuit 301, a memory controller (CTRL) 302, a memory 303, a D/A converter circuit 304 and an analog expansion circuit (EXP) 305.

The analog compression circuit 300 of the digital delay circuit serves to obtain an analog signal G by compressing an analog signal F, which includes an original signal A and an echo signal B attenuated suitably by the attenuator 5, according to a compression function 300a or an approximation function thereof. The compression function 300a represents a convexed curve starting at an original point with the largest gradient as shown in FIG. 1. With such compression function, it is possible to obtain a dynamic range for 8 bits of 90 dB which corresponds to that obtainable with 15 bits. The compression function will be described in detail later.

The A/D converter circuit 301 converts the compressed analog signal G into a digital signal H. In this case, since the digital signal H is 8 bits, the circuit construction of the A/D converter 301 may be simpler compared with that of high precision which requires 15 bits.

The memory 303 is controlled by the memory controller 302 to store 8 bits of the digital signal H sequentially. Since the number of bits for each word of this memory 303 is also 8, its size may be about a half of that having 15 bits.

The memory controller 302 reads out a 8-bit data stored in the memory 303 in advance by a predetermined delay time as a digital signal I and sends it to the D/A converter circuit 304.

The D/A converter circuit 304 converts the digital signal I into an analog signal which is output as a delay signal J. Since the digital signal I is also 8 bits, the circuit construction of the D/A converter 304 can be made simpler. 8 bits in a mere linear conversion corresponds to 48 dB. However, since the digital signal I is digitized by non-linear transformation with local tone, that is, tone of signal having large amplitude, being sacrificed, a dynamic range of the delay signal J restored becomes 90 dB or more and particularly about 96 dB.

The analog expansion circuit 305 expands the delayed signal J according to the reverse function of the compression function 300a or an approximation function thereof and the resultant expanded signal is output as an echo signal B. The analog compression circuit 300 and the analog expansion circuit 305 may comprise usual circuits for generating logarithmic function and root mean square function using amplifiers. Since such circuits are simple in construction, they do not make the whole echo attaching circuit complex.

In order to prevent aliasing distortion from occurring, the low-pass filters 2 and 4 which allow signal component having frequency a half of the sampling frequency of the delay circuit to pass through are arranged in the upstream of the analog compression circuit 300 and the downstream of the D/A converter 304, respectively. Alternatively, the LPF 2 may be arranged after the analog compression circuit 300 and the LPF 4 may be arranged before the D/A converter 304.

With such circuit construction, the signal F including the original signal A and the echo signal B is delayed by a constant time by the delay circuit composed of the analog compression circuit 300, the A/D converter 301, the memory controller 302, the memory 303, the D/a converter 304 and the analog expansion circuit 305, resulting in the echo signal B.

The echo signal B thus produced is attenuated suitably by the attenuator 6 and attached to the original signal A in the waveform synthesizer 7. In this manner, the original signal A is converted into the echo signal B which circulates while being attenuated, repeatedly, resulting in the audio signal C attached with echo. The audio signal C is finally amplified and output externally as sound or recorded on a tape, etc., through a recording circuit.

In this case, since the dynamic range of the original signal A itself can be easily maintained at 90 dB or more by processing it in the side of circuit in which the signal is processed, the dynamic range of the original signal A and that of the echo signal B are 90 dB or more, respectively, and the dynamic range of the audio signal C is also maintained at 90 dB. Tone as a whole is maintained by the original signal A even if tone of the echo signal is degraded, causing substantially no problem concerning to tone.

The compression function 300a which is monotonously increasing, convex curve will be described. In order to facilitate the understanding of this, logarithmic function which may be used in the field of digital communication, etc., will be described first and, then, square root function will be described.

For simplicity of description, compression function normalized by using assumption of minimum and maximum values of the analog signal F which is the input signal of the analog compression circuit 300 and the analog signal G which is the output signal of the circuit 300 being "0" and "1", respectively, will be described. In this case, the compression function describes lines each passing through an original point (0,0) and a point (1,1), as shown in FIG. 1.

logarithmic function which is monotonously increasing, convex function is not fixedly defined even if it is normalized by adding condition of passing through the original point (0,0) and the point (1,1). There is one freedom of tilting left as it is. Therefore, by defining the freedom by an inclination at the original point (0,0) as shown by a dotted line in FIG. 1, the shape of the logarithmic function is fixedly defined.

On the other hand, the inclination of compression function at the original point means amplification of a minute or small input signal. This inclination corresponds to increasing rate for dynamic range when linearly converted with inclination "1". Therefore, by performing compression according to logarithmic function whose inclination at the original point is sharp, it is possible to improve dynamic range correspondingly to degradation of tone of a large sound.

In the field of digital communication, "$\mu$-255 logarithmic compression/expansion method" has been used as one of methods by which wider dynamic range is obtained with smaller amount of communication.

In this method, in order to harmonize tone and dynamic range, the inclination at the original point is made in the order of 16 (see 300b in FIG. 1) with which a dynamic range of 72 dB corresponding to 12 bits can be obtained for 8-bit digital communication. However, this is for the case where an original signal is compressed and played back in expansion as it is. Conditions therefore are different from those for an echo attaching circuit for producing echo component. That is, since the echo signal is not used independently, dynamic range has a priority in the present invention, sacrificing tone. From this, dynamic range is further increased. In order to realize it, it is preferable to make the inclination (=output signal level/input signal level) of the output signal to the input signal at the original point is set 32 or more as shown by the chain line in FIG. 1. By this, 5 bits or more can be saved. For example, in a case where the number of bits of a digital signal is 8 and inclination at the original point is 128 (see 300a in FIG. 1), a dynamic range of 90 dB corresponding to 15 bits is obtainable effectively.

A case where square root function is used as compression function will be described. By using the above mentioned normalization, function shape of square root function is fixedly defined. In such case, inclination at the original point becomes infinite in theory. However, with conversion into digital value, an inclination passing through a minimum value represented by digital value becomes effective inclination. It becomes amplification for minute and small signal.

Therefore, with a digital signal of n bits, its minimum value is (1/n powers of 2). Since it is square root function, an effective inclination becomes substantially n powers of 2. This is an effective inclination of 256 when the number of bits of a digital signal is 8. That is, when square root function is used, it is possible to obtain a dynamic range of 96 dB corresponding effectively to 16 bits.

As a concrete function shape of compression function, it is not limited to logarithmic function and square root function both of which have been described here. It may be cubic root or higher root function. Although not practical in circuit construction, it may be 1.5 power root function. What is necessary is any function which has a monotonously increasing, convex shape in order to sacrifice accuracy of conversion on the side of large amplitude audio signal.

Compression function and expansion function may be those approximated by for example linear line segments. When such approximated function is used, circuit construction usually becomes simpler.

In the embodiment described above, the attenuator 5 is inserted between the analog expansion circuit 305 and the analog compression circuit 300, in order to make the difference from the conventional example clear. However, this attenuator 5 may be connected between the output of the D/A converter 304 and the input of the A/D converter 301. In such case, since signal which is fedback locally for generation of echo signal component is not compressed/expanded too much, it is possible to prevent degradation of echo signal correspondingly.

Further, the attenuator 5 may be constituted as a digital circuit, which is connected between the output and the input of the memory controller 302 to reduce the output digital value by subtraction, multiplication or bit-shifting and to return the attenuated value to the input side to thereby add it to the input of the A/D converter 301. In such case, the waveform shaper 1 becomes unnecessary. By this, signal which is fedback locally for generation of echo signal component is not compressed/expanded too much and is insensitive to external turbulence such as cross-talk noise since it is digital signal. As a result, it is possible to prevent degradation of echo signal.

Figure 2:
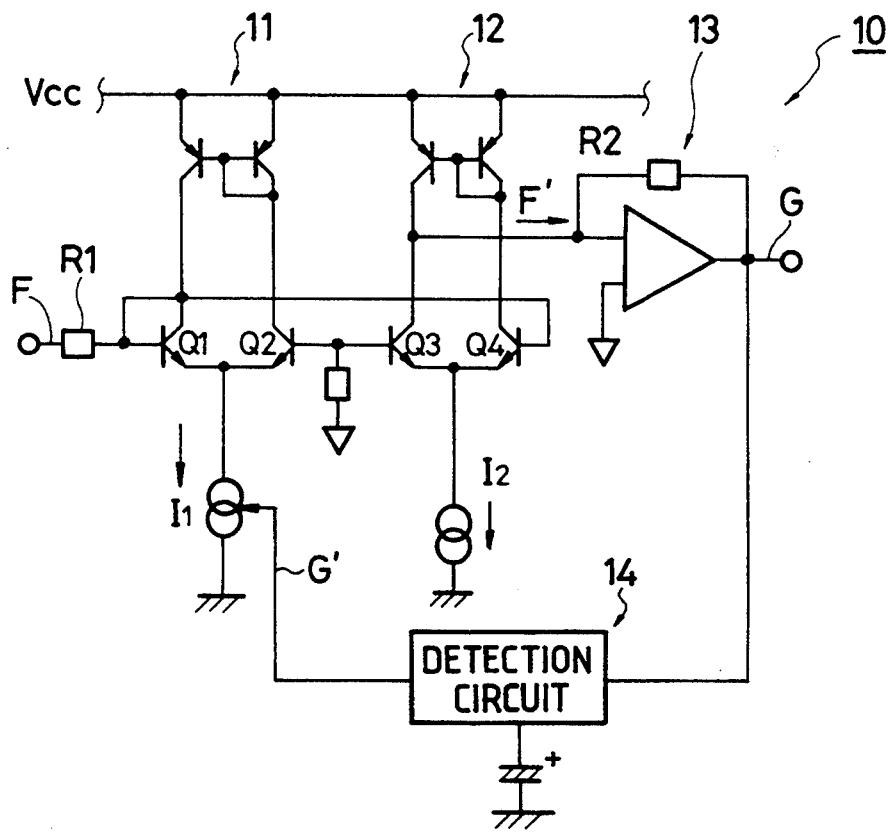
FIG. 2 is a block circuit diagram of an embodiment of a logarithmic conversion circuit according to the present invention.

The echo attaching circuit is used as a portion of circuit for realizing the Karaoke function. Microphone to be used in Karaoke tends to produce noise and is sensitive to external noise. If such is mixed in on the side of the echo attaching circuit, resultant echo quality becomes not acceptable. A logarithmic amplifier circuit for restricting noise of such kind will be described with reference to FIG. 2.

A logarithmic converter 10 includes an initial stage differential amplifier circuit 11, a second stage differential amplifier circuit 12, an output stage amplifier circuit 13 and a detection circuit 14.

The differential amplifier circuit 11 is composed of a transistor load having current-mirror connection, a pair of differential transistors Q1 and Q2 having collectors supplied with identical currents by means of the transistor load and a current control circuit provided in the downstream of the differential transistors for controlling operating currents I1 thereof, all of which are connected in the order and inserted between a power source line Vcc and a ground line GND. The transistor Q1 has a base supplied with the input signal F through a resistor R1 and the transistor Q2 has a base supplied with a reference voltage.

Figure 4:
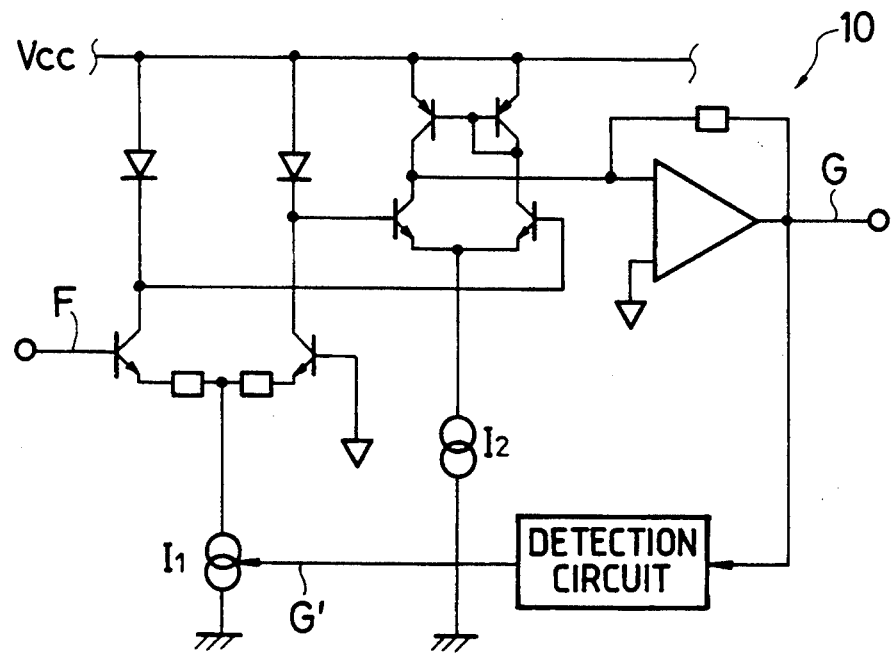
FIG. 4 is a block circuit diagram of another embodiment of the logarithmic conversion circuit according to the present invention.
Figure 5:
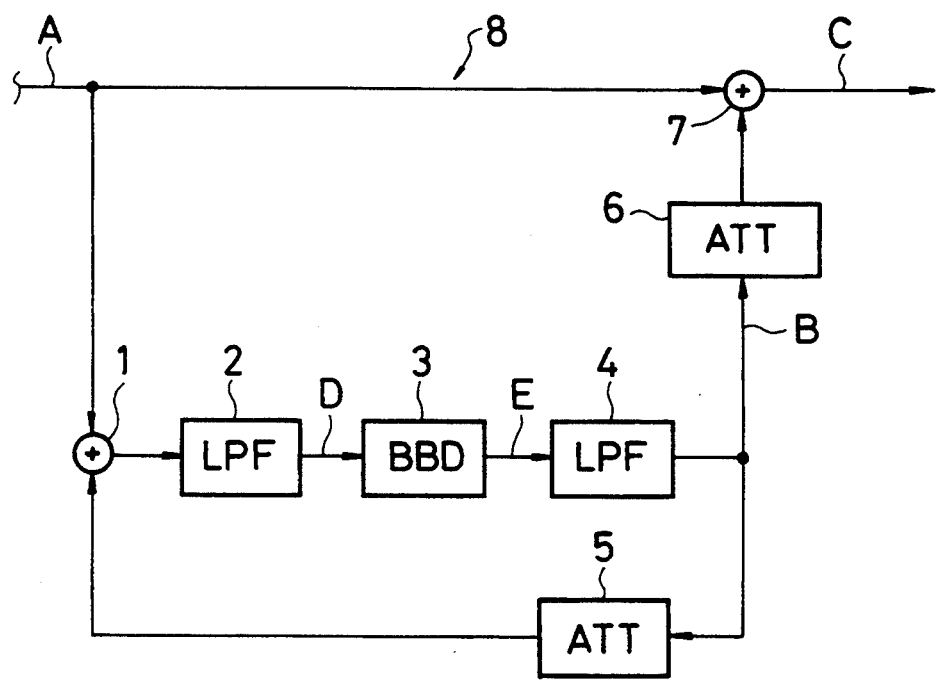
FIG. 5 is a block circuit diagram of a conventional echo attaching circuit constructed by using BBD.
Figure 6:
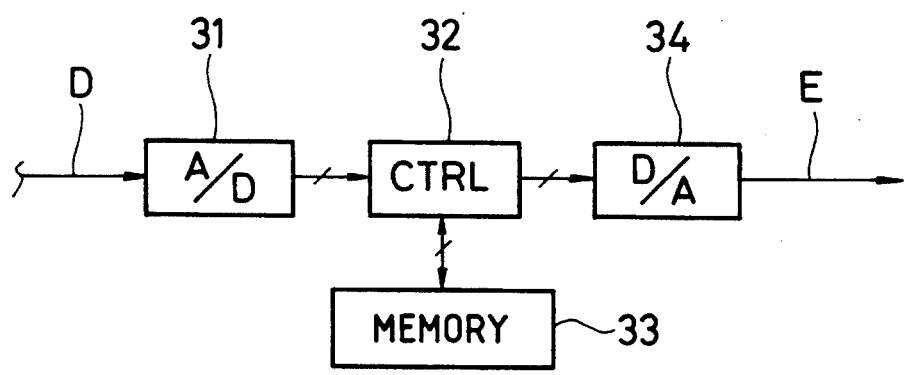
FIG. 6 is a block circuit diagram of a conventional echo attaching circuit constructed by using a digital circuit.

The base and a collector of the transistor Q1 are connected to each other to obtain a diode characteristics whose exponential characteristics is utilized. Alternatively, it is possible to insert a resistor on the side of its emitter to produce an amount of feedback having exponential function characteristics, as shown in FIG. 4.

The differential amplifier circuit 12 also includes a transistor load having current mirror connection, a pair of differential transistors Q3 and Q4 having collectors supplied with identical currents by means of the transistor load and a current control circuit provided in the downstream of the differential transistors for controlling operating currents I2 thereof, all of which are connected in the order and inserted between a power source line Vcc and a ground line GND. The transistor Q4 has a base supplied with a collector voltage of the transistor Q1 on the side of the input signal F of the differential amplifier circuit 11 and the transistor Q3 has a base supplied with the reference voltage.

The output stage amplifier circuit 13 is input with a current signal F' which is an output of the differential amplifier circuit 12, amplifies it and converts it into a voltage signal, resulting in an output signal G.

The detection circuit 14 detects an amplitude level of the output signal G, resulting in a detection signal G'.

The detection signal G' is fedback to the current control circuit of the differential amplifier circuit 11 as a control signal for controlling the operating current I1 according to the level of the output signal G.

With such construction as mentioned above, the input signal F which is a voltage signal is converted into a current signal through the resistor R1, upon which the differential amplifier circuit produces a voltage difference caused by this current signal as a difference of base-emitter voltages of the transistors Q1 and Q2. Then, by the differential amplifier circuit 12, the voltage difference is converted into a current difference and output as a current signal F'. The current signal F' is output as the output voltage signal G through a resistor R2 of the output stage amplifier circuit 13.

At this time, amplification of the whole circuit receiving the input signal F and outputting the output signal G is usually determined by resistance ratio between the resistors R2 and R1 and current ratio between the current I2 and I1.

Since this amplification depends upon the current ratio between the current I2 which is constant and the current I1 which is controlled by the level of the output signal G, the whole circuit is a circuit having amplification variable according to the level of its output signal G fedback. The variation of amplification is logarithmic since the amplification of the differential amplifier circuit 11 varies exponentially with respect to the operating current I1 and the operating current I1 itself is controlled by the amount of feedback (voltage value or current value).

Figure 3:
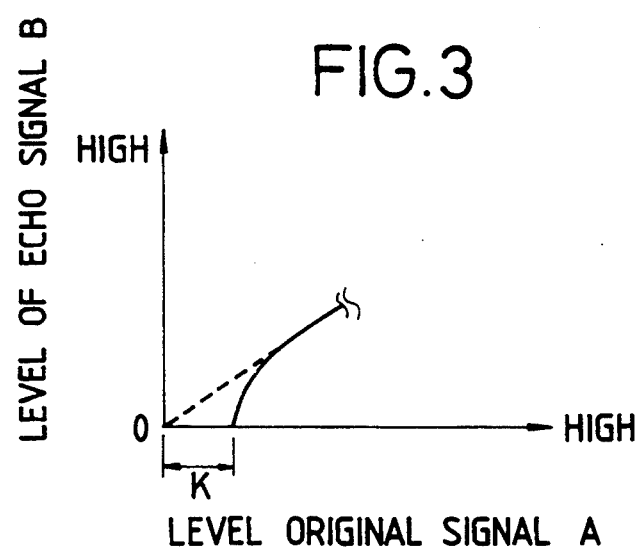
FIG. 3 is a graph showing a conversion characteristics of the logarithmic conversion circuit.

Further, since the resistors R1 and R2 are fixed, the resistance ratio therebetween is constant. When the signal level of the input signal F becomes low and thus the level of the output signal G and hence the operating current I1 become small, operating resistance of the transistors Q1 and Q2 becomes not negligible. The operating resistance serves apparently as a resistor connected in series with the resistor R1 in view of amplification. Therefore, as shown by the characteristics curve of the portion of the original point in FIG. 3, an insensitive portion K is provided for a minute input signal F. When the signal level of the input signal F is minute, the amplitude level of the output signal G is more limited than in the case of the essential logarithmic conversion based on the current ratio. Therefore, the output signal B is produced when the input signal F is higher in level than this level.

Microphone to be used for Karaoke usually picks up human voice which does not cause an electric signal level corresponding thereto to be so high as mentioned previously while it is not so small. On the other hand, such microphone may picks up even minute signal. Therefore, by more restricting the amplitude level of the output signal G to obtain the characteristics shown in FIG. 3, external noise which is lower than human voice and picked up the microphone can be restricted. Therefore, it is possible to prevent noise from mixing in and circulating through the echo attaching circuit. As a result, quality of echo becomes acceptable.

FIG. 4 shows another embodiment of the present invention. Since its operation and effect resulting there-from are similar to those of the previous embodiment, details thereof are omitted.

What is claimed is:

1. An echo attaching circuit for producing an echo signal by delaying an audio signal and outputting the audio signal together with the echo signal, comprising:

an analog signal compression circuit responsive to an audio signal or a signal including an audio signal and an echo signal for compressing the audio signal or the signal according to a compression function exhibiting compression rate for a large amplitude range larger than that for a smaller amplitude;

an A/D converter for converting an output signal of the analog signal compression circuit into a digital signal;

a memory for storing the digital signal;

a D/A converter for converting the digital signal stored in the memory for a predetermined delay time into an analog signal and for supplying the analog signal as a delay signal;

a control circuit for writing said digital signal from said A/D converter in said memory and reading out said digital signal written in said memory and sending it to said D/A converter;

an analog expansion circuit for expanding the delay signal according to a reverse function to the compression function and outputting it as an echo signal; and wherein said compression function is a monotonously increasing, convex function which is represented by a convex curve starting at an original point at which a gradient of the curve is greatest, and wherein the original point corresponds to a lowest level of the echo signal of differential transistors and a current control circuit connected downstream of said differential transistor pair for controlling an operation current to said differential transistors, for producing a voltage signal corresponding to a difference between said input signal and a predetermined reference value, a second amplifier circuit responsive to said voltage signal for producing a current signal corresponding to the value of said voltage signal and a third amplifier circuit responsive to said current signal for producing said output signal by amplifying said current signal with a predetermined amplification, whereby said value of said operating current is controlled according to said output signal so that said output signal is produced according to said compression function.

2. The echo attaching circuit claimed in claim 1, wherein said compression function has a characteristics providing an inclination of said output signal with respect to said input signal of 32 or more at an original point (0,0) when said input signal and said output signal of said analog compression circuit are normalized with maximum and minimum values thereof being set to "1" and "0", respectively.

3. The echo attaching circuit claimed in claim 2, wherein said compression function is one of logarithmic function and square root function.

4. The echo attaching circuit claimed in claim 3, further comprising:

a first filter provided in the upstream of said A/D converter and a second filter provided in the downstream of said D/A converter, wherein said first and second filters allow frequency components whose frequencies are equal to or lower than a half of a sampling frequency of said A/D converter and said D/A converter to pass through; and means to attenuate said echo signal to produce an attenuated echo signal, combine the attenuated echo signal with said audio signal to produce a combined signal and supply the combined signal to said first filter.

5. The echo attaching circuit claimed in claim 1, wherein said analog compression circuit comprises a first amplifier circuit including a pair of differential transistors and a current control circuit connected to a downstream of said differential transistor pair for controlling an operating current to said differential transistors, for producing a voltage signal corresponding to a difference between said input signal and a predetermined reference value, a second amplifier circuit responsive to said voltage signal for producing a current signal corresponding to the value of said voltage signal and a third amplifier circuit responsive to said current signal for producing said output signal by amplifying said current signal with a predetermined amplification, whereby said value of said operating current is controlled according to said output signal so that said output signal is produced according to said compression function.

6. The echo attaching circuit according to claim 5, wherein a base and a collector of one of said differential transistors which receives said input signal are connected together.

7. An audio device for producing an echo signal by delaying an audio signal and outputting the audio signal together with the echo signal as sound, comprising:

an analog signal compression circuit responsive to an audio signal or a signal including an audio signal and an echo signal for compressing the audio signal or the signal according to a monotonously increasing, convex compression function which is represented by a convex curve starting at an original point at which a gradient of the curve is greatest, and wherein the original point corresponds to a lowest level of the echo signal;

an A/D converter for converting an output signal of said analog signal compression circuit into a digital signal;

a memory for storing the digital signal;

a D/A converter for converting the digital signal stored in the memory for a predetermined delay time into an analog signal and for supplying the analog signal as a delay signal; and an analog expansion circuit for expanding the delay signal according to a reverse function to the compression function and outputting it as an echo signal.

8. The audio device according to claim 7, further comprising a control circuit for writing said digital signal from said A/D converter in said memory and reading out said digital signal written in said memory and sending it to said D/A converter.

* * * * *